(12) United States Patent
Erdler

(10) Patent No.: US 8,664,732 B2
(45) Date of Patent: Mar. 4, 2014

(54) MAGNETIC PRESSURE SENSOR

(71) Applicant: Micronas GmbH, Freiburg (DE)

(72) Inventor: Gibert Erdler, Ettlingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 13/706,821

(22) Filed: Dec. 6, 2012

(65) Prior Publication Data

US 2013/0140652 A1 Jun. 6, 2013

Related U.S. Application Data

(60) Provisional application No. 61/577,281, filed on Dec. 19, 2011.

(30) Foreign Application Priority Data

Dec. 6, 2011 (DE) .......................... 10 2011 120 166

(51) Int. Cl.
*H01L 27/22* (2006.01)
(52) U.S. Cl.
USPC .................................. 257/415; 257/E27.005
(58) Field of Classification Search
None
See application file for complete search history.

(56) References Cited

U.S. PATENT DOCUMENTS

| 4,541,288 A * | 9/1985 | Kornrumpf et al. ....... 73/862.69 |
| 6,178,995 B1 | 1/2001 | Ohmi et al. |
| 2007/0164427 A1 | 7/2007 | Sauciuc et al. |
| 2008/0308886 A1 | 12/2008 | Ausserlechner et al. |
| 2011/0123783 A1 * | 5/2011 | Sherrer ...................... 428/195.1 |
| 2011/0252882 A1 | 10/2011 | Beck et al. |

FOREIGN PATENT DOCUMENTS

| DE | 699 28 047 T2 | 7/2006 | |
| DE | 10 2008 027 999 A1 | 12/2008 | |
| DE | 10 2009 005 186 B3 | 7/2010 | |
| DE | 10 2010 022 427 A1 | 12/2010 | |
| DE | 102010022427 A1 * | 12/2010 | ................ G01L 9/14 |

OTHER PUBLICATIONS

Ripka, Pavel, "Advances in Magnetic Field Sensors", IEEE Sensor Journal, vol. 10, No. 6 (Jun. 2012) pp. 1108-1116.*
Todaro, M.T., et. al., Magnetic Field Sensors Based on Micromechanical Systems (MEMS) Technology, downloaded from URL <http://cdn.intechopen.com/pdfs/30946/InTech- Magnetic_field_sensors_based_on_microelectromechanical_systems_mems_technology.pdf> on Oct. 10, 2013.*

* cited by examiner

*Primary Examiner* — Thomas L Dickey
*Assistant Examiner* — Joseph Schoenholtz
(74) *Attorney, Agent, or Firm* — Muncy, Geissler, Olds & Lowe, PLLC

(57) ABSTRACT

A magnetic pressure sensor is provided that includes a semiconductor body with a top side and a back side, a Hall sensor formed on the top side of the semiconductor body, a spacer connected to the semiconductor body, whereby the spacer has a recess in the center, and a membrane covering the recess, whereby the membrane has a first material and has a ferromagnetic substance. The ferromagnetic substance concentrates a magnetic flux density of a source formed outside the ferromagnetic material, and the spacer is formed as a circumferential wall and has a second material and the second material is different from the first material in at least one element.

16 Claims, 4 Drawing Sheets

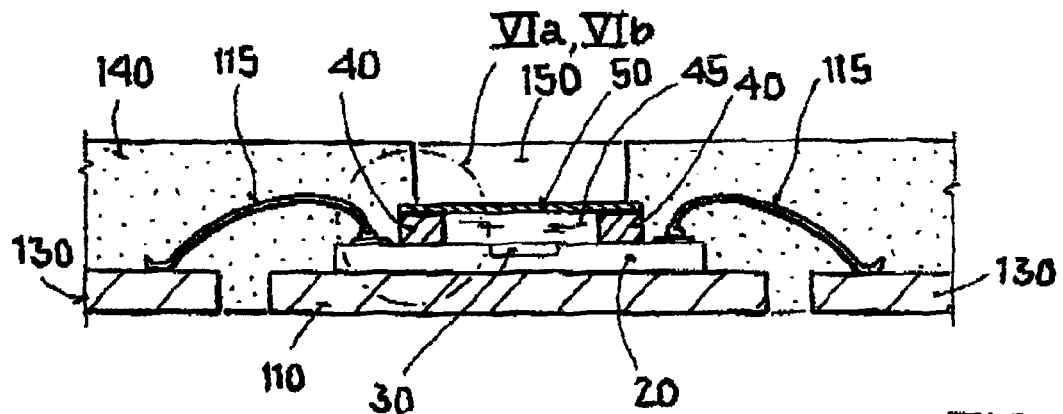
FIG.5
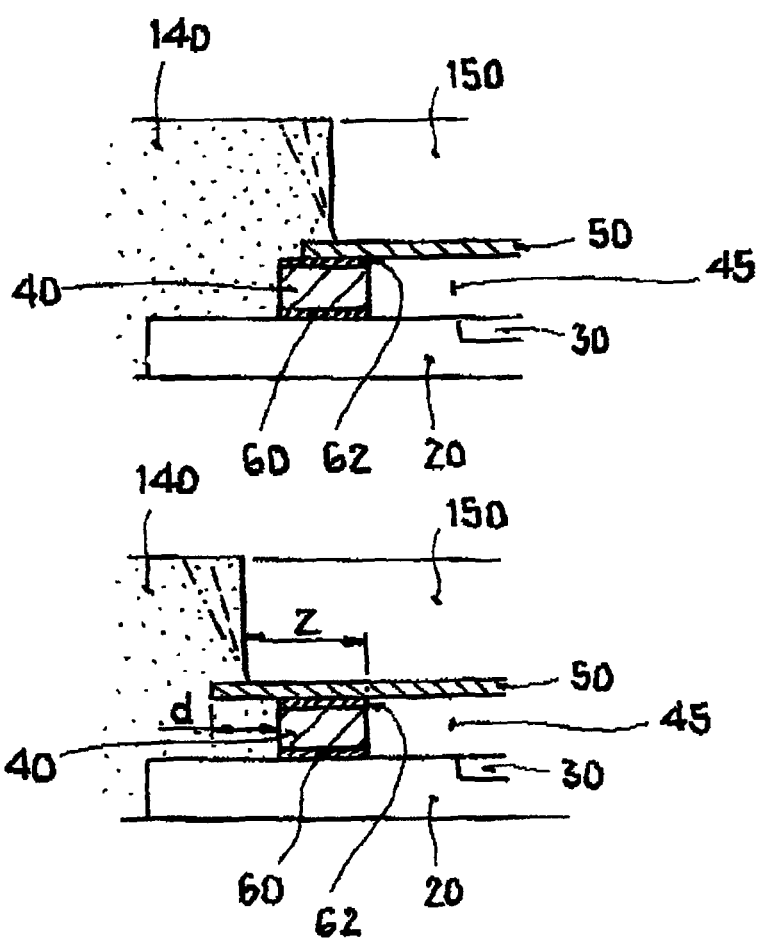
FIG.6a
FIG.6b

MAGNETIC PRESSURE SENSOR

This nonprovisional application claims priority to German Patent Application No. DE 10 2011 120 166.5, which was filed in Germany on Dec. 6, 2011, and to U.S. Provisional Application No. 61/577,281, which was filed on Dec. 19, 2011, and which are both herein incorporated by reference.

BACKGROUND OF THE INVENTION

1. Field of the Invention

The present invention relates to a magnetic pressure sensor.

2. Description of the Background Art

DE 195 10 365 A1 discloses a mechanical electrical transducer element. In this regard, a Hall voltage is generated by the deflection of a membrane, which has a magnetic layer. The magnetic layer serves as a magnetic field source.

SUMMARY OF THE INVENTION

It is therefore an object of the present invention to provide a magnetic pressure sensor, which refines the state of the art.

According to an embodiment of the invention, a magnetic pressure sensor is provided comprising a semiconductor body with a top side and a back side and a Hall sensor formed on the top side of the semiconductor body, and a spacer connected to the semiconductor body, whereby the spacer has a recess in the center, and a membrane covering the recess, whereby the membrane has a first material and comprises a ferromagnetic substance, and the ferromagnetic substance concentrates a magnetic flux density of a source formed outside the ferromagnetic material, and the spacer is formed as a circumferential wall and has a second material and the second material is different from the first material in at least one element. The hall sensor can be an integrated hall sensor and can form a portion of the semiconductor body. The hall sensor can be formed on an upper surface of the semiconductor body such that the hall sensor is completely covered by a passive layer formed on the upper surface. It should be noted that the membrane at a pressure difference between the top surface of the membrane and the back surface of the membrane, which faces the top side of the semiconductor body, performs an excursion and causes a change in the magnetic flux density and the Hall voltage in that the membrane encompasses the ferromagnetic layer. It should be noted further that the wall can be formed in the form of a cylindrical ring. It should be noted further that the Hall sensor can be covered by the spacer or by the recess in the spacer.

An advantage of the device of the invention is that a simple and reliable integrated pressure sensor can be produced, which is based on the change in a local magnetic flux density resulting from a movement or elongation of the membrane. In this regard, the change in the flux density in the Hall sensor is detected as a change in a Hall voltage. Tests have shown that it is advantageous to adjust the thickness of the layer of the membrane and the size of the membrane to the pressure range to be measured. In this regard, a thicker membrane and/or a smaller diameter of the membrane are selected for the measurement of high pressures. It is understood that the spacer forms a closed and pressure-tight space with the top side of the semiconductor body and the membrane, and the Hall sensor is disposed on the top side of the space closed in such a way. In this respect, a difference in the pressure between the surroundings, i.e., therefore outside the pressure-tight space, and the pressure-tight space causes an elongation of the membrane. If the pressure of the surroundings drops in comparison with the pressure in the space, the membrane arches outwardly, i.e., in the direction of the surroundings and vice versa.

According to an embodiment, the membrane has a mu-metal layer, whereby the mu-metal layer is formed preferably as a single layer or multiple layers. In another preferred refinement, the membrane is made of a composite material, whereby the composite material preferably comprises a polymer layer. It is evident that ferromagnetic particles can be incorporated in the polymer layer and form a closed ferromagnetic layer. An advantage of the composite material is that a greater membrane elasticity can be achieved particularly with a polymer membrane in comparison with a single-layer thin metal layer. In particular, the elastic properties can be adjusted to the pressure range to be measured. In so doing, the membrane for the measurement of high pressure has a lower modulus of elasticity, i.e., the membrane is stiffer, than for the measurement of low pressure.

According to a further embodiment, an adhesive layer is formed between the membrane and the spacer. An adhesive layer can be formed between the spacer and the semiconductor body. An advantage of the adhesive layer is that a reliable and simple sealing can be formed both between the membrane and the top surface of the spacer and also between a bottom side of the spacer and the top side of the semiconductor body. According to a preferred embodiment, a circumferential film, coated on both sides with adhesive, is formed between a top surface of the spacer and the membrane and between a bottom side of the spacer and the top side of the semiconductor body. The film can be made as a strip-shaped plastic film.

In another embodiment, the spacer has a plastic, preferably of a photopatternable polymer, particularly of a polyimide or an SU8 lacquer. As a result, the production of the spacer can be carried out by means of a photolithographic process and integrated advantageously and cost-effectively into the fabrication process of a CMOS process. According to another embodiment, the spacer contains ferromagnetic substances. An advantage of the ferromagnetic version of the spacer is that the magnetic closure, i.e., the size of the magnetic flux through the Hall sensor increases compared with the version without a ferromagnetically formed spacer. As a result, the change in the Hall voltage based on a predetermined elongation is increased and the sensitivity of the pressure sensor is increased. The spacer in another embodiment can be made as a permanent magnet with the use of hard magnetic ferromagnetic materials as a filling material and subsequent magnetization. An advantage of the aforementioned embodiment is that an external magnet becomes unnecessary and the overall size is reduced.

According to an embodiment, the wafer is diced after the application of the plurality of spacers and each semiconductor body is arranged and housed on a metal substrate.

According to another embodiment, the spacer has a bar on at least one outer side. Preferably, the spacer is connected to other spacers by means of the bar. Tests have shown that a plurality of spacers, connected to one another by means of bars, can be arranged in a matrix. An advantage is that the plurality of spacers can be arranged in a work step aligned on a so-called lead frame level on the top side on a plurality of semiconductor bodies and a costly lithography process for the formation of the spacer is not necessary.

The lead frame level in this case is understood to be a plurality of diced semiconductor bodies, which are arranged according to the matrix of the spacers. According to a refinement, the semiconductor bodies are housed separated on the lead frame level and then cut free. According to the design of an IC housing, part of the bar is visible on the outer side of the IC housing.

According to another embodiment, the spacer or the wall has a substantially rectangular cross section, instead of a ring-shaped cross section, and a height in the range of at least 20 µm to maximum of 1 mm.

In a further embodiment, a second Hall sensor, integrated into the semiconductor body, is provided at a distance from the first Hall sensor. In this way, the Hall voltages of both Hall sensors can be compared and interfering DC magnetic fields can be largely eliminated. Furthermore, in an alternative embodiment, it is preferred to orient the Hall sensors relative to the Earth's magnetic field differently to one another and hereby to detect different spatial components of the magnetic flux change as a result of membrane elongation.

A metal substrate with a plurality of pins for accommodating the semiconductor body can be provided. A plurality of metal surfaces and an integrated circuit are formed on the top side of the semiconductor body and the pins are connected to the metal surfaces by bonding wires and there is an electrical functional connection between the Hall sensor and the integrated circuit and an IC housing is provided and the IC housing accommodates at least partially the metal substrate with the semiconductor body and the pins, whereby the pins project partially from the IC housing and the IC housing has an opening at least the size of the membrane. Furthermore, the metal surfaces are connected to the integrated circuit by means of traces.

In an embodiment, a permanent magnet is disposed below the semiconductor body, preferably within a single mutual housing. Tests have shown that it is preferable that the distance between the bottom side of the semiconductor body and the permanent magnet is less than 2 mm, preferably less than 0.3 mm.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 5 shows a cross-sectional view of a second housed embodiment with a spacer formed within the housing as a permanent magnet;

FIG. 6a shows a first detail view of the membrane-housing connection of the embodiment of FIG. 5;

FIG. 6b shows a second detail view of the membrane-housing connection of the embodiment of FIG. 5;

DETAILED DESCRIPTION

Figure 1A:
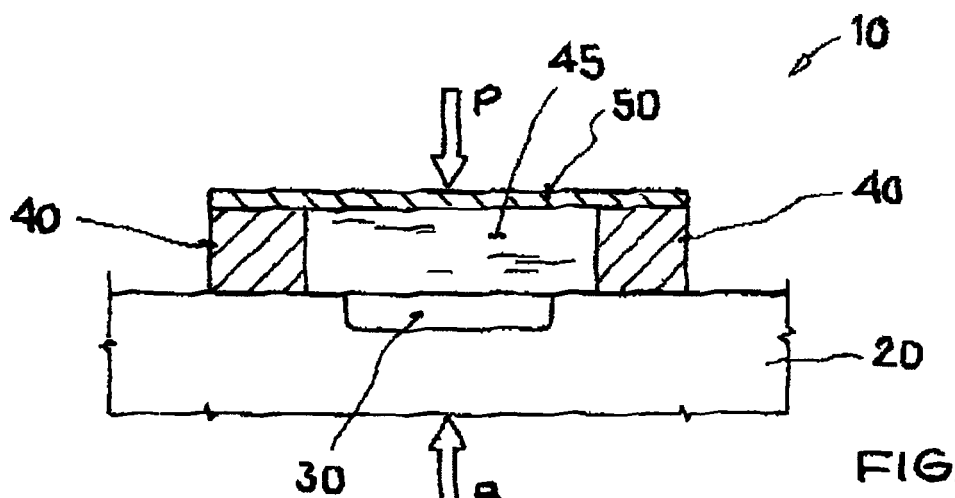
FIG. 1a shows a cross-sectional view of an embodiment of the invention of a magnetic pressure sensor.

The illustration of FIG. 1 shows a cross-sectional view of a magnetic pressure sensor 10 of the invention, comprising a semiconductor body 20 with a top side and a back side, a Hall sensor 30 formed on and integrated into the top side of semiconductor body 20, a spacer 40 connected to semiconductor body 20, whereby spacer 40 has a recess 45 in the center, and a membrane 50 covering recess 45. Membrane 50 has a first material and comprises a ferromagnetic substance, whereby the ferromagnetic substance concentrates a magnetic flux density of a source B formed outside the ferromagnetic material. Spacer 40 is formed as a circumferential wall and has a second material, whereby the second material differs from the first material in at least one element. The one bottom side of spacer 40 is connected to the top side of semiconductor body 20 and membrane 50 to a top surface of spacer 40. Spacer 40 together with the top side of semiconductor body 20 and membrane 50 forms a gas-tight space.

The gas-tight space has an internal pressure of about one bar. An ambient pressure P presses on membrane 50. In the shown embodiment, the membrane is in the resting position; i.e., the internal pressure is approximately as great as the ambient pressure. If the ambient pressure P is greater than the internal pressure, because of the pressure difference a resulting force arises and membrane 50 arches inwardly into the gas-tight space. Hereby, the number of the magnetic flux lines, which are concentrated from the immediate vicinity of the Hall sensor or the semiconductor body by ferromagnetic membrane 50, which is formed preferably as a mu-metal layer, in the Hall sensor is changed. Stated differently, in the case of inward curving the extent of the magnetic flux in the Hall sensor and hereby the Hall voltage are increased.

Figure 1B:
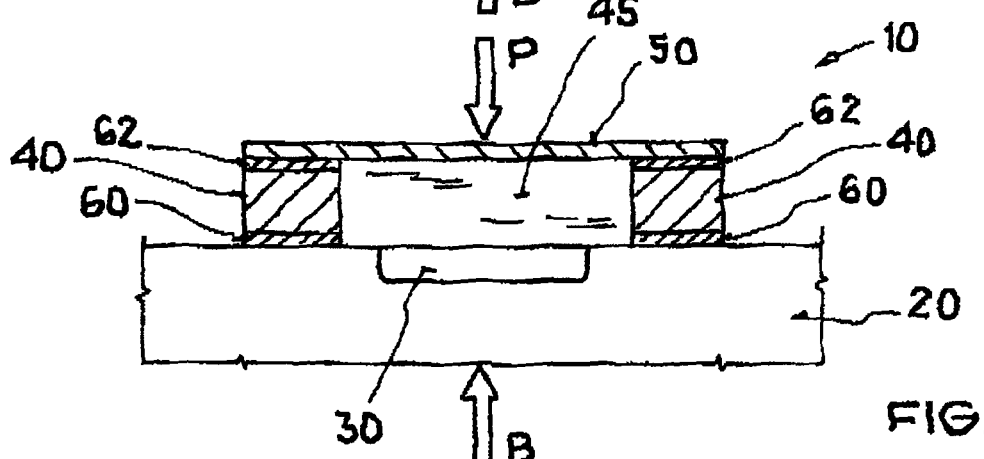
FIG. 1b shows a cross-sectional view of another embodiment of the invention of a magnetic pressure sensor.

A view of another embodiment of a magnetic pressure sensor is shown in FIG. 1b. Only the differences to the preceding embodiments will be described below. A first adhesive layer 60 is formed between the bottom side of spacer 40 and the top side of semiconductor body 20. A second adhesive layer 62 is formed between the top surface of spacer 40 and membrane 50. First adhesive layer 60 and second adhesive layer 62 form a gas-tight space together with spacer 40, the top side of semiconductor body 20, and membrane 50. Tests have shown that an especially durable and gas-tight embodiment can be formed with the formation of first adhesive layer 60 and second adhesive layer 62. Silicon-containing adhesives are preferred in particular in this case. It should be noted that according to an alternative embodiment during the formation of the spacer by means of a photolithographic process the formation of the first adhesive layer is not necessary.

Figure 2:
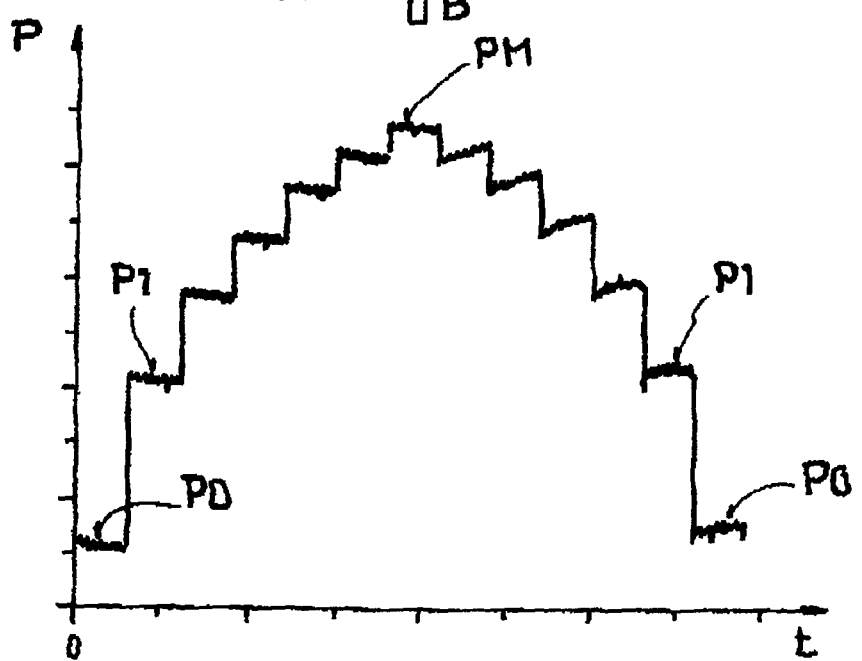
FIG. 2 shows a characteristic of the course of the Hall voltage over time for different pressures.

A characteristic of the course of a Hall voltage IH over a time t for different pressure differences is shown in FIG. 2. Based on an outer magnetic field, for example, a permanent magnet (not shown) and the effected Hall voltage, a Hall voltage results even at the beginning of the measurement, although there is no pressure difference. If now a first pressure difference P1 is formed, a stepped increase in the Hall voltage occurs immediately. If the ambient pressure is increased in further uniform steps up to a maximum differential pressure PM, the Hall voltage also increases in steps. It is evident that with a uniform stepped increase in the ambient pressure, the Hall voltage also increases in steps. However, in the case of the Hall voltage the step height is smaller with increasing ambient pressure. Furthermore, proceeding from the maximum ambient pressure with a stepped decrease toward a normal pressure, i.e., no differential pressure, the reversibility of the magnetic pressure sensor is shown.

Tests have shown that the decline in the step height during an increase in the Hall voltage is based substantially in the decreasing elongation of membrane 50. Because the space below membrane 50 is closed gas-tight, the internal pressure of the space closed gas-tight increases during an inward curving of the membrane. Furthermore, with increasing elongation the membrane also has an overproportional increase in the reset force. Both effects cause a decreasing step height with increasing pressure.

Figure 3:
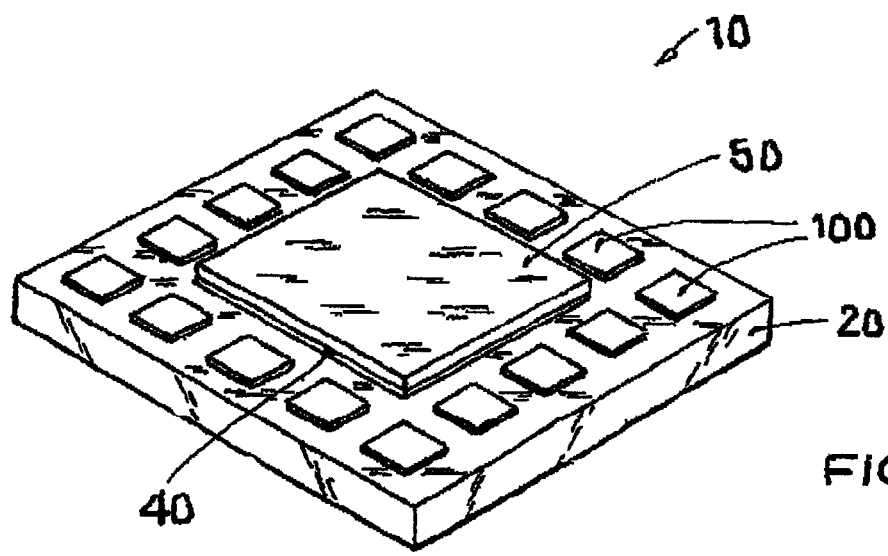
FIG. 3 shows a plan view of another embodiment of a magnetic pressure sensor.

A plan view of another embodiment of a magnetic pressure sensor is shown in FIG. 3. Only the differences to the preceding embodiments will be described below. Spacer 40 on the top side of semiconductor body 20 has a square design and is completely covered by membrane 50. Metal surfaces 100 for an electrical connection of an integrated circuit, which is not shown, are arranged at the edges of semiconductor body 20. The integrated circuit is connected, furthermore, to Hall sensor 30, which is not visible.

Figure 4:
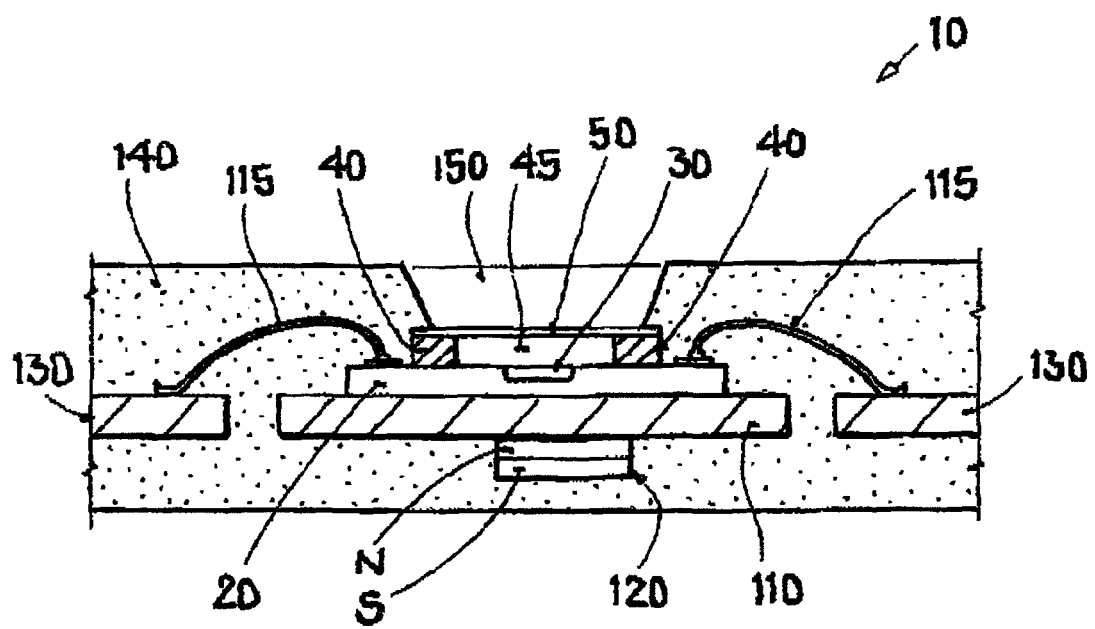
FIG. 4 shows a cross-sectional view of a first housed embodiment.

A cross-sectional view of a first housed embodiment is shown in FIG. 4. Only the differences to the preceding embodiments will be described below. Semiconductor body 20 is arranged on a metal substrate 110 with a plurality of pins 130. A permanent magnet 120 is formed below metal substrate 110. Metal surfaces 100 are connected by means of bonding wires 115 to pins 130 for electrical contacting. An integrated circuit, which is not shown, is formed on the top side of semiconductor body 20. There is an electrical functional connection by means of traces between Hall sensor 30 and the integrated circuit. Further, an IC housing 140 is provided, whereby IC housing 140 accommodates at least partially metal substrate 110 with semiconductor body 20, permanent magnets 120, and pins 130, and pins 130 project partially from IC housing 140. Further, IC housing 140 has an opening 150 tapering in the direction toward membrane 50. The size of opening 150 is at least the size of membrane 50.

Permanent magnet 120 has a north pole and a south pole. Semiconductor body 30 and permanent magnet 120 are arranged in the same housing 70 in such a way that the field lines of permanent magnet 120 penetrate Hall sensor 30. It should be noted that according to an alternative embodiment (not shown), permanent magnet 120 instead of being integrated into IC housing 140 is arranged outside IC housing 140, preferably below metal substrate 110.

A cross-sectional view of a second housed embodiment is shown in FIG. 5. Only the differences to the preceding embodiments will be described below. IC housing 140 surrounds metal substrate 110 only on a top side according to the design of a so-called QFN housing. Spacer 40 is formed as a permanent magnet. Accordingly, the arrangement of permanent magnet 120 is unnecessary. Further, opening 150 has a uniform diameter over the entire course up to membrane 50.

A first detail view or a second detail view of the transition between membrane 50 and spacer 40 in the illustration of FIG. 5 is shown in FIGS. 6a and 6b, respectively. Only the differences to the preceding embodiments will be described below. Whereas in FIG. 6a membrane 50 does not completely cover the surface area of the spacer, i.e., is set back compared with the outer edge of the spacer, in the illustration of FIG. 6b the outer edge of spacer 40 is completely run over at the top surface of membrane 50 at a distance d. Further, in FIG. 6a housing 140 is set back versus the inner edge of spacer 40, so that IC housing 140 begins between the outer edge and the inner edge of spacer 40. In contrast, in the embodiment shown in the illustration of FIG. 6b, IC housing 140 begins outside of the outer edge of spacer 40. An advantage of the last mentioned embodiment is that the membrane is connected preferably by material bonding to housing 140 on both sides. In this way, the membrane can be connected reliably to IC housing 140 especially also during strong movements of the membrane.

Figure 7:
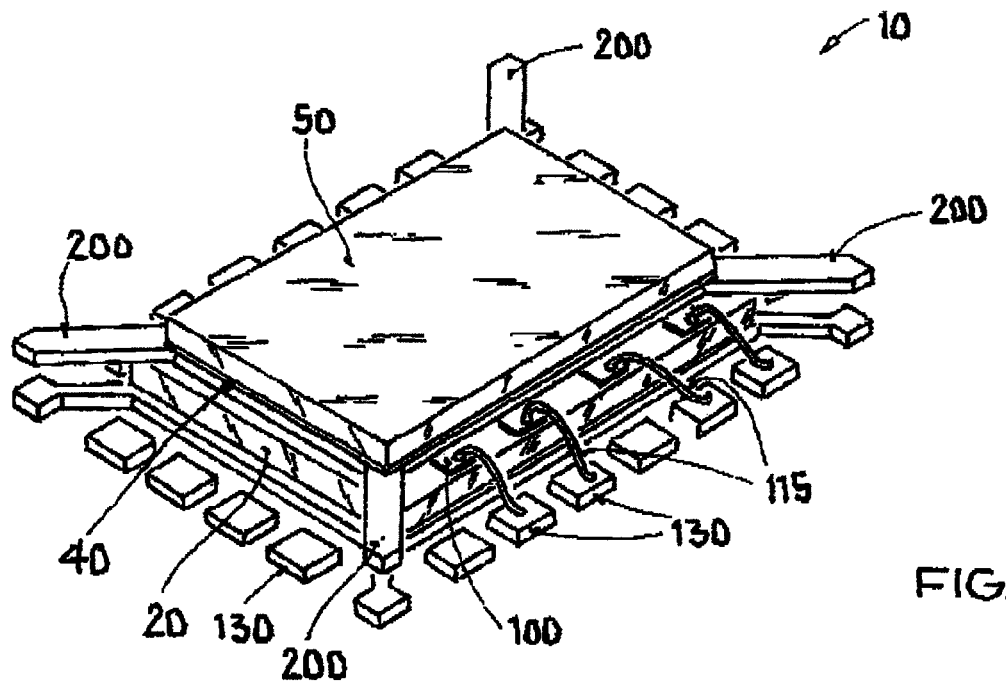
FIG. 7 shows a plan view of an embodiment of the magnetic pressure sensor with side struts on the spacer.

A plan view of another embodiment with side struts at the spacer is shown in FIG. 7. Only the differences to the preceding embodiments will be described below. The square formed spacer 40 has struts 200 at each of the four corners. Struts 200 connect neighboring spacers to form a matrix (not shown). In this way, after dicing of the wafer with the formation of a plurality of semiconductor bodies on a lead frame level, according to the arrangement of the lead frame of individual spacers connected to one another into a matrix, by means of an adjustment step, the matrix can be positioned on the arrangement of the lead frame.

An advantage is that a plurality of materials, particularly also ferromagnetic materials, can be used to form the matrix. Further, with the positioning of the matrix fabrication costs can be reduced considerably compared with a costly single positioning.

Figure 8:
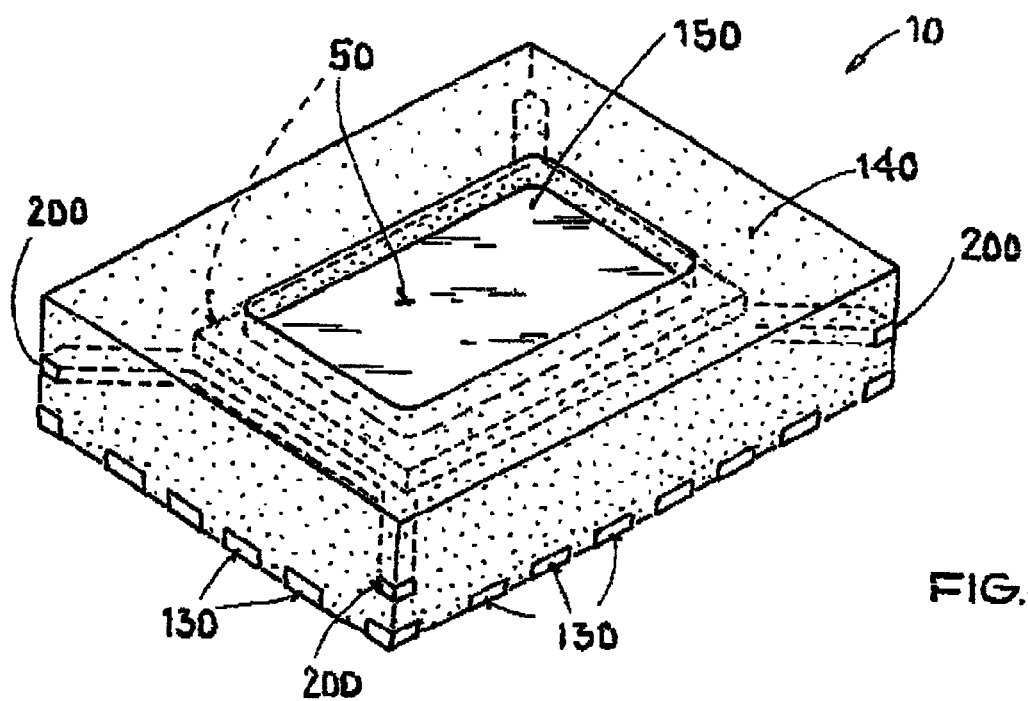
FIG. 8 shows a plan view of a housed embodiment of the magnetic pressure sensor of FIG. 7.

A plan view of a housed embodiment of the magnetic pressure sensor of FIG. 7 is shown in FIG. 8. Only the differences relative to the embodiment of FIG. 7 will be described below. IC housing 140 is formed as a QFN housing. Struts 200 are partially visible on the outer sides of the IC housing. The IC housing has opening 150 in the center. Opening 150 is bounded by membrane 50 and by IC housing 140.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A magnetic pressure sensor comprising:
   a semiconductor body with a top side and a back side;
   a Hall sensor arranged on the top side of the semiconductor body;
   a spacer connectable to the semiconductor body, the spacer having a recess in a center thereof; and
   a membrane covering the recess,
   wherein the membrane has a first material and comprises a ferromagnetic substance, the ferromagnetic substance concentrating a magnetic flux density of a source formed outside of the ferromagnetic material, and
   wherein the spacer is formed as a circumferential wall and has a second material, the second material being different from the first material in at least one element.

2. The magnetic pressure sensor according to claim 1, wherein the membrane has a single-layer mu-metal layer.

3. The magnetic pressure sensor according to claim 1, wherein the membrane has a composite material and the composite material comprises a polymer layer.

4. The magnetic pressure sensor according to claim 1, wherein an adhesive layer is formed between the membrane and the spacer.

5. The magnetic pressure sensor according to claim 1, wherein the spacer is formed of plastic.

6. The magnetic pressure sensor according to claim 1, wherein the spacer contains ferromagnetic substances.

7. The magnetic pressure sensor according to claim 1, wherein the spacer is a permanent magnet.

8. The magnetic pressure sensor according to claim 1, wherein an adhesive layer is formed between the spacer and the semiconductor body.

9. The magnetic pressure sensor according to claim 1, wherein the spacer has a bar on at least one outer side.

10. The magnetic pressure sensor according to claim 8, wherein a portion of the bar is visible on an outer side of an integrated circuit housing.

11. The magnetic pressure sensor according to claim 1, wherein the wall has a substantially rectangular cross section and a height in the range of at least 20 µm to a maximum of 1 mm.

12. The magnetic pressure sensor according to claim 1, wherein the spacer has a top surface and a circumferential film coated on both sides, and is formed between the top surface of the spacer and the membrane.

13. The magnetic pressure sensor according to claim 1, wherein a second Hall sensor is integrated into the semiconductor body and is provided at a distance from the first Hall sensor.

14. The magnetic pressure sensor according to claim 1, wherein a permanent magnet is disposed below the semiconductor body.

15. The magnetic pressure sensor according to claim 1, wherein a distance between the semiconductor body and the permanent magnet is less than 0.3 mm.

16. The magnetic pressure sensor according to claim 1, wherein a metal substrate with a plurality of pins for accommodating the semiconductor body is provided, wherein a plurality of metal surfaces and an integrated circuit are formed on the top side of the semiconductor body, wherein pins are connected to the metal surfaces by bonding wires, wherein there is an electrical functional connection between the Hall sensor and the integrated circuit, wherein an IC housing is provided and the IC housing accommodates at least partially the metal substrate with the semiconductor body and the pins, wherein the pins project partially out of the IC housing, and wherein the IC housing has an opening at least the size of the membrane.

* * * * *